US010878919B2

(12) United States Patent
Cho et al.

(10) Patent No.: US 10,878,919 B2
(45) Date of Patent: Dec. 29, 2020

(54) DEVICE AND METHOD FOR INITIALIZING CHANNEL IN NONVOLATILE MEMORY DEVICE

(71) Applicant: SAMSUNG ELECTRONICS CO., LTD., Suwon-si (KR)

(72) Inventors: Doo Ho Cho, Seoul (KR); Kyo Man Kang, Gunpo-si (KR); Dae Seok Byeon, Seongnam-si (KR); Jung Ho Song, Gwangmyeong-si (KR); Chi Weon Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/420,850

(22) Filed: May 23, 2019

(65) Prior Publication Data

US 2020/0152275 A1 May 14, 2020

(30) Foreign Application Priority Data

Nov. 12, 2018 (KR) ........................ 10-2018-0137949

(51) Int. Cl.

| G11C 16/04 | (2006.01) |
| G11C 16/24 | (2006.01) |
| G11C 16/30 | (2006.01) |
| G11C 16/08 | (2006.01) |
| G11C 16/26 | (2006.01) |
| G11C 16/16 | (2006.01) |
| G11C 16/34 | (2006.01) |

(52) U.S. Cl.
CPC .............. *G11C 16/24* (2013.01); *G11C 16/08* (2013.01); *G11C 16/16* (2013.01); *G11C 16/26* (2013.01); *G11C 16/30* (2013.01); *G11C 16/3459* (2013.01)

(58) Field of Classification Search
CPC ......... G11C 16/24; G11C 16/08; G11C 16/16; G11C 16/26; G11C 16/30; G11C 16/3459
See application file for complete search history.

(56) References Cited

U.S. PATENT DOCUMENTS

| 7,403,429 | B2 * | 7/2008 | Chae ...................... G11C 16/16 |
| | | | 365/185.24 |
| 8,089,815 | B2 | 1/2012 | Li et al. |
| 8,154,924 | B2 | 4/2012 | Park et al. |
| 8,542,533 | B2 | 9/2013 | Maejima et al. |
| 9,293,208 | B2 | 3/2016 | Yoo et al. |
| 9,349,471 | B2 * | 5/2016 | Yun ..................... G11C 16/3431 |
| 9,899,093 | B2 | 2/2018 | Lee et al. |
| 9,905,298 | B2 * | 2/2018 | Joo ......................... G11C 16/10 |
| 10,629,254 | B2 * | 4/2020 | Kwak ................. G11C 11/5628 |
| 2011/0222345 | A1 | 9/2011 | Li et al. |
| 2012/0320678 | A1 | 12/2012 | Maejima et al. |
| 2013/0201760 | A1 | 8/2013 | Dong et al. |
| 2014/0056065 | A1 | 2/2014 | Dong et al. |
| 2014/0247659 | A1 | 9/2014 | Dong et al. |
| 2017/0337973 | A1 | 11/2017 | Lee et al. |

* cited by examiner

*Primary Examiner* — Pho M Luu
(74) *Attorney, Agent, or Firm* — F. Chau & Associates, LLC

(57) ABSTRACT

A method for initializing a channel in a non-volatile memory device comprising a memory block including a plurality of word lines and a plurality of string selection lines, includes applying a voltage to the plurality of string selection lines; converting a bit line passing through the block into a floating state; and a releasing the floating state of the bit line.

20 Claims, 9 Drawing Sheets

DEVICE AND METHOD FOR INITIALIZING CHANNEL IN NONVOLATILE MEMORY DEVICE

CROSS-REFERENCE TO RELATED APPLICATION

This non-provisional patent application claims the benefit of priority under 35 USC § 119 to Korean Patent Application No. 10-2018-0137949, filed on Nov. 12, 2018, in the Korean Intellectual Property Office, the disclosure of which is incorporated by reference in its entirety herein.

BACKGROUND

1. Technical Field

The present inventive concept relates to a device and method for initializing a channel in a memory device, and more particularly, to a device and method for initializing a channel in a non-volatile memory device, capable of reducing power consumption.

2. Discussion of Related Art

NAND flash memory is a type of non-volatile memory that does not require power in order to retain data. A 3D NAND flash memory consists of tiers of NAND flash memories stacked on top of each other. Such a 3D NAND flash memory has considerably improved performance in terms of a degree of integration, storage capacity, speed, durability, and power consumption, as compared with a NAND flash memory arranged as a planar structure.

Each tier includes strings and string selection lines, where each string includes memory cells connected between a string select transistor and a ground select transistor. The memory cells may be organized into an array of rows and columns, where word lines connect the rows and bits lines connect the columns.

When a read operation or write verify operation is performed in the non-volatile memory device, power may be unnecessarily consumed due to the influence of a parasitic capacitance present in the word lines when the selected and non-selected string selection lines are initialized.

SUMMARY

At least one exemplary embodiment of the present inventive concept provides a device and method for initializing a channel in a non-volatile memory device, capable of reducing power consumption by controlling bit lines at the time of initializing selected and non-selected string selection lines in a read operation or a write verify operation.

According to an exemplary embodiment of the present inventive concept, a method for initializing a channel in a non-volatile memory device having a memory block including a plurality of word lines and a plurality of string selection line, includes applying a voltage to the plurality of string selection lines; converting a bit line passing through the memory block into a floating state; and releasing the floating state of the bit line.

According to an exemplary embodiment of the present inventive concept, a method for initializing a channel in a non-volatile memory device having a memory block including a plurality of word lines and a plurality of string selection, includes converting a bit line passing through the memory block into a floating state; applying a voltage to the plurality of string selection lines; and releasing the floating state of the bit line.

According to an exemplary embodiment of the present inventive concept, a device for initializing a channel in a non-volatile memory device having a memory block including a plurality of word lines and a plurality of string selection lines, includes a voltage generator applying a voltage to the plurality of string selection lines; a first circuit converting a bit line passing through the memory block into a floating state; and a second circuit releasing the floating state of the bit line.

BRIEF DESCRIPTION OF DRAWINGS

The present inventive concept will be more clearly understood from the following detailed description, taken in conjunction with the accompanying drawings, in which.

DETAILED DESCRIPTION OF THE EXEMPLARY EMBODIMENTS

Figure 1:
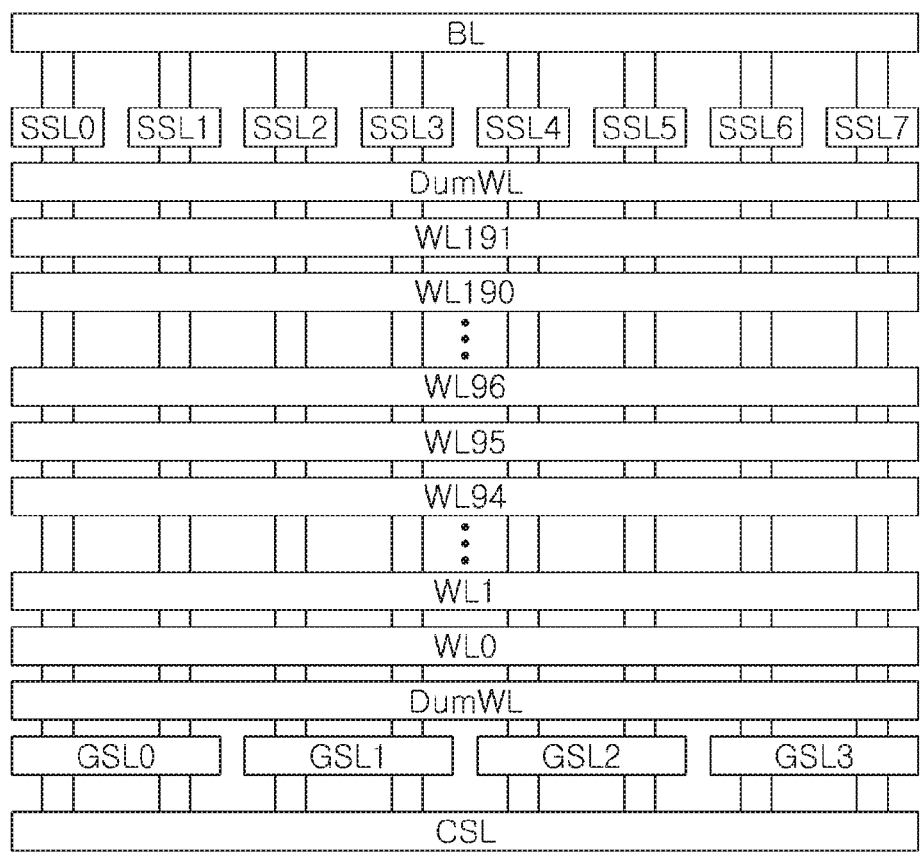
FIG. 1 is a schematic diagram illustrating a case in which a channel of a selected/non-selected string is initialized with a voltage applied from a bit line by turning on all string selection lines in a block.

The details of other embodiments may be included in the detailed description and the drawings.

The present inventive concept and the manner of achieving features thereof will become apparent with reference to the exemplary embodiments described in detail below with reference to the accompanying drawings. The present inventive concept may, however, be embodied in many different forms, and should not be construed as being limited to the exemplary embodiments set forth herein. These embodiments are provided so that the disclosure is thorough and complete, and conveys the scope of the invention to those skilled in the art. Like reference numerals refer to like elements throughout the specification.

A semiconductor memory (e.g., a nonvolatile memory device) that may be used in embodiments of the inventive concept includes a memory cell array, which includes a plurality of memory blocks. The memory cell array may be connected to an address decoder through word lines, string selection lines, and ground selection lines, and to a read/write circuit through bit lines. Each memory block may include multiple memory cells and multiple selection transistors. The memory cells of each memory block may be stacked in a direction perpendicular to a substrate to form a 3D structure.

The address decoder may be connected to the memory cell array through the word lines, the string selection lines, and the ground selection lines. The address decoder may receive an address from an external device, decode a row address from the received address, and select word lines, string selection lines, and ground selection lines based on the decoded row address. The address decoder may transfer voltages from an external device to selected and unselected string selection lines, word lines, and ground selection lines.

The read/write circuit may be connected to the memory cell array through bit lines. The read/write circuit may receive a decoded column address from the address decoder and select some of the bit lines using the decoded column address. The read/write circuit may receive data from an external device, and write the received data to the memory cell array.

In an exemplary embodiment, each of the memory blocks includes multiple cell strings. For example, a first group of the cell strings may be arranged in a vertical direction spaced apart from one another to form a first column of cell strings, a second group of the cells strings may be arranged in a vertical direction spaced apart from one another to form a second column of cell strings, where the first and second columns are spaced apart from one another. There may be additional columns of cell strings adjacent to the first and second columns, but for ease of discussion, only two are discussed herein.

Each cell string of the first column of cell strings may include a ground selection transistor, a plurality of memory cells, and a string selection transistor stacked in a height direction perpendicular to a substrate. Similarly, each cell string of the second column of cell strings may include a ground selection transistor, a plurality of memory cells, and a string selection transistor stacked in a height direction perpendicular to a substrate.

A first one of the cell strings of the first column of cell strings may be connected to a first one of the cell strings of the second column of cells strings by a first string selection line to form a first row, a second one of the cell strings of the first column of cell strings may be connected to a second one of the cell strings of the second column of cells strings by a second string selection line to form a second row, etc.

For example, the selection transistors in the first cell string of the first column of cell strings and the first cell string of the second column of cells strings may be connected in common to the first string selection line, the selection transistors in the second cell string of the first column of cell strings and the second cell string of the second column of cells strings may be connected in common to the second string selection line, etc. The first column of cells strings may be connected to a first bit line, the second column of cell strings may be connected to a second bit line, etc.

The memory cells at the same height from a substrate may be connected in common to a same word line, and memory cells at different heights may be connected to different word lines. Ground selection transistors of the cell strings may be connected in common to a common source line. A 3D NAND flash memory structure may be constructed from the above-described memory blocks.

FIG. 1 is a schematic diagram illustrating a case in which a channel of a selected/non-selected string (e.g., one of the above cell strings) is initialized with a voltage applied from a bit line by turning on all string selection lines in a block (e.g., one of the memory blocks). FIG. 1 illustrates a single bit line BL, string selection lines SSL0, SSL1, SSL2, SSL3, SSL4, SSL5, SSL6, and SSL7, dummy word lines DumWL, word lines WL0, WL1, . . . , WL94, WL95, WL96, . . . , WL190, and WL191, ground selection lines GSL0, GSL1, GSL3, and GSL3, and a common source line CSL. While FIG. 1 shows 8 string selection lines SSL, 192 word lines WL, and 4 ground selection lines GSL, the inventive concept is not limited thereto. For example, there may be less than or more than 8 string selection lines SSL, less than or more than 192 word lines WL, and less than or more than 4 ground selection lines GSL. Further, the dummy word lines DumWL may be omitted.

Figure 2:
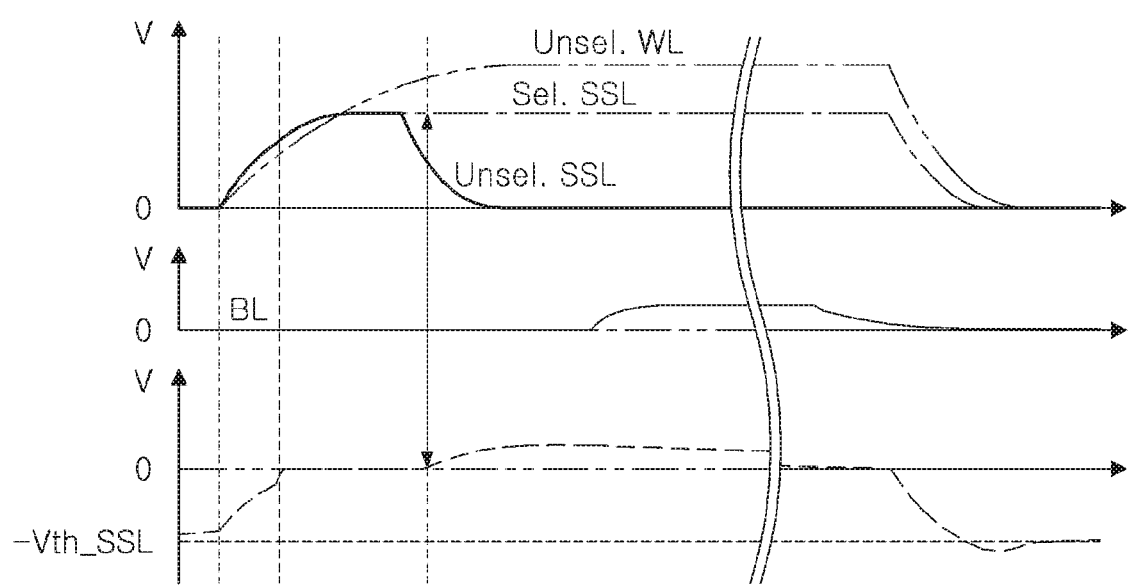
FIG. 2 is a graph illustrating an exemplary change in voltage appearing in each element in a block in an operation of FIG. 1.
Figure 3:
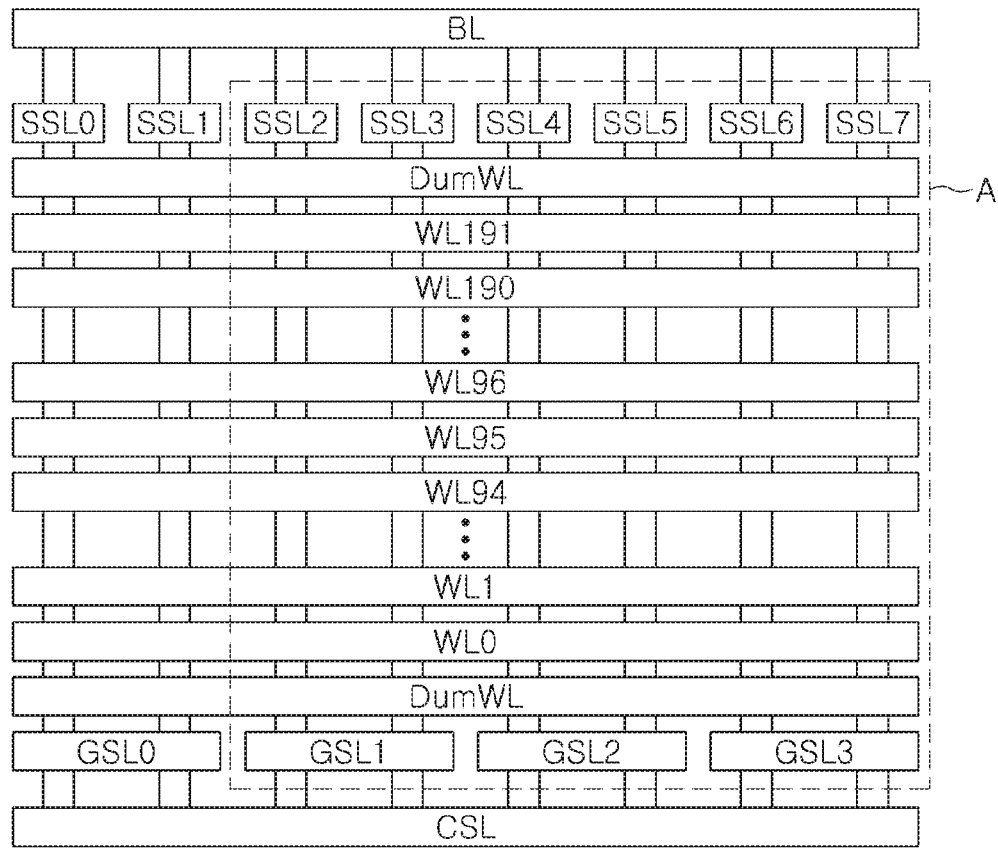
FIG. 3 is a schematic diagram illustrating a case of initializing by turning off non-selected string selection lines in a block.
Figure 4:
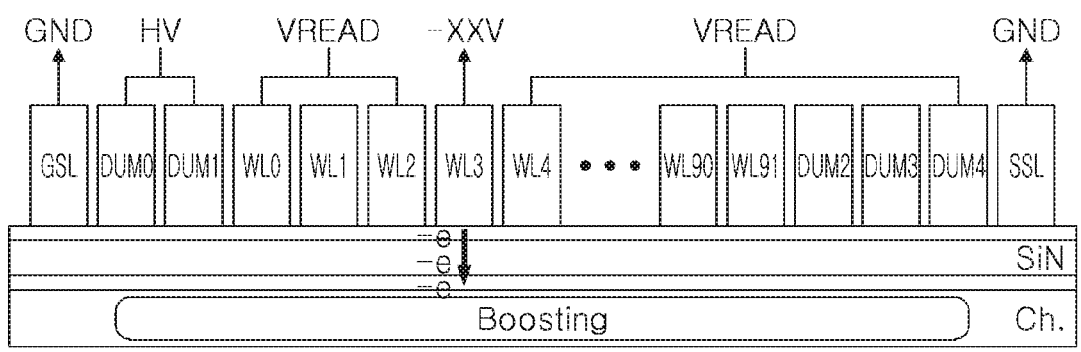
FIG. 4 is a schematic diagram illustrating an exemplary soft erase phenomenon that may occur in an operation of FIG. 1.

FIG. 2 is a graph illustrating a change in voltage occurring in each element in a block in an operation of FIG. 1. FIG. 3 is a schematic diagram illustrating a case of initializing by turning off non-selected string selection lines in a block. For example, FIG. 3 illustrated the schematic of FIG. 1, but further illustrates turning off non-selected string selection lines SSL2-SSL7 in an area A of a block during the initializing. FIG. 4 is a schematic diagram illustrating an exemplary soft erase phenomenon that may occur in an operation of FIG. 1.

Each of the memory blocks of the 3D NAND flash memory may be divided into a plurality of sub-blocks. A given one of the sub-blocks may be selected using some of the string selection lines. When applying a read operation and/or a write verify operation to the 3D NAND flash memory using multiple string selection lines SSL, a process of initializing each string (e.g., each cell string) may be performed. However, power may be unnecessarily consumed due to a parasitic capacitance present on one or more of the word lines of the semiconductor memory.

For example, as illustrated in FIGS. 1 and 2, when a method in which all string selection lines present in a memory block are turned on, and channels of selected strings and non-selected strings are initialized with a voltage applied from a bit line and a voltage is applied to a word line at the same time, is applied, a voltage difference between a channel to be initialized and the word line may be increased, such that consumption of electric charge contributing to a parasitic capacitance present in the word line may be increased.

When 0V is applied to a bit line BL as illustrated in a second graph of FIG. 2, and a voltage is also applied to a word line WL as illustrated in a first graph of FIG. 2, in a state in which all string selection lines illustrated in FIG. 1 are turned on, a relatively large potential difference may occur between the word line WL having a relatively high voltage value and the bit line BL to which 0V is applied. During initializing in this method, there may be a situation in which the parasitic capacitance present over all the string selection lines needs to be filled with electric charge, such that the power consumption may be inevitably increased.

When a connection between a bit line BL and a channel of a non-selected string selection line is blocked by turning off non-selected string selection lines in area A, as illustrated in FIG. 3, to reduce an amount of electric charge consumed, there may be a problem where a non-selected cell is programmed to an unintended value by boosting the channel of the non-selected string due to influence of the set word line WL voltage. For example, as illustrated in FIG. 4, when a negative voltage is applied to a selected word line WL3, a deterioration phenomenon, soft erasing due to a potential difference with the boosting channel, may occur. In the example shown in FIG. 4, the string selection lines SSL and the gate selection line GSL output a ground voltage GND, a high voltage HV is applied to dummy word lines DUM0 and DUM1, a read voltage is applied to word lines WL0, WL2, and WL4, and word line WL3 outputs a negative voltage −XXV.

Therefore, at least one embodiment of the present inventive concept provides a method for initializing a channel in a non-volatile memory device, which may solve the power consumption problem of the initialization method illustrated in FIGS. 1 and 2, without causing the problem of the deterioration phenomenon of the initialization method illustrated in FIGS. 3 and 4.

Figure 5:
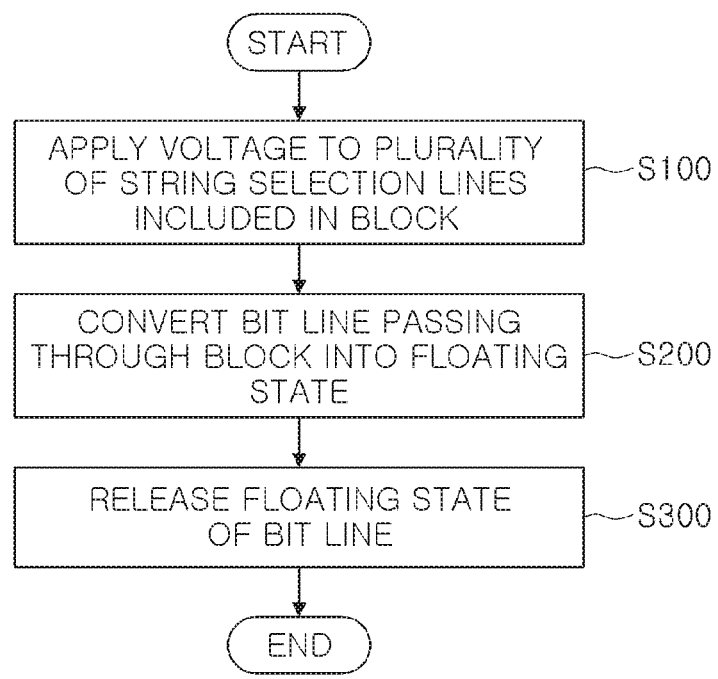
FIG. 5 is a flowchart illustrating a method for initializing a channel in a non-volatile memory device according to an exemplary embodiment of the present inventive concept.
Figure 6:
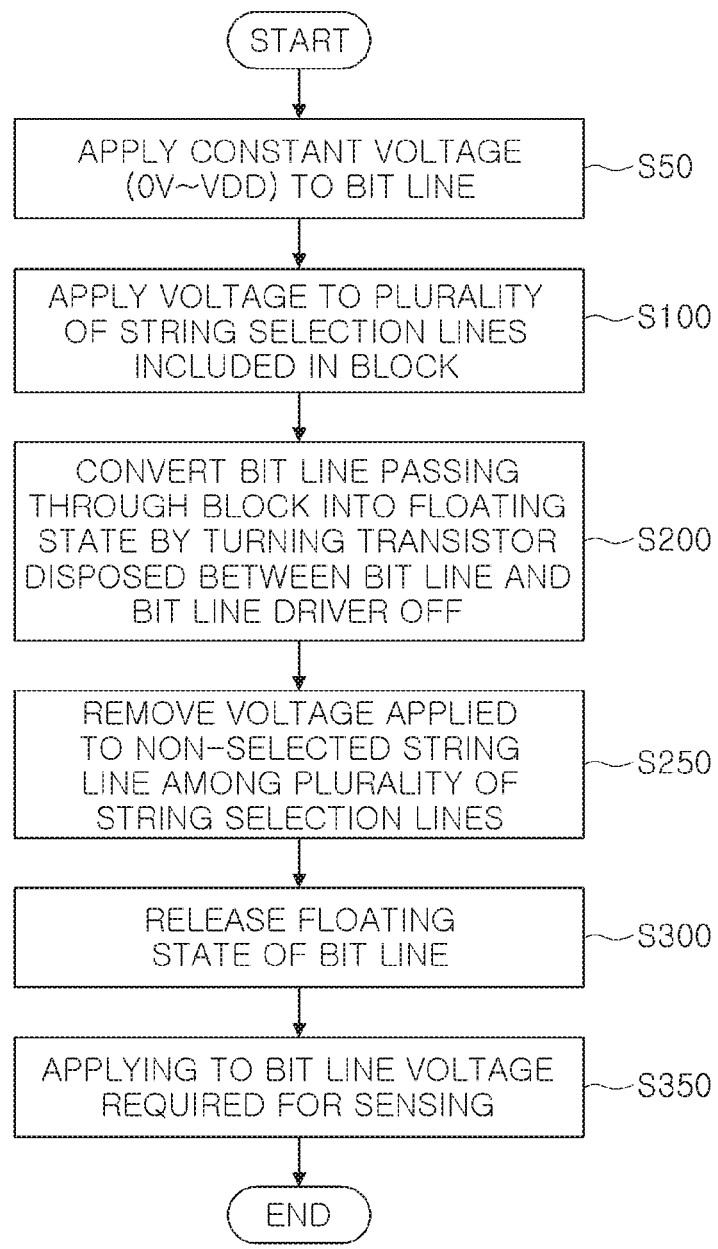
FIG. 6 is a flowchart illustrating a method for initializing a channel in a non-volatile memory device according to an exemplary embodiment of the present inventive concept.
Figure 7:
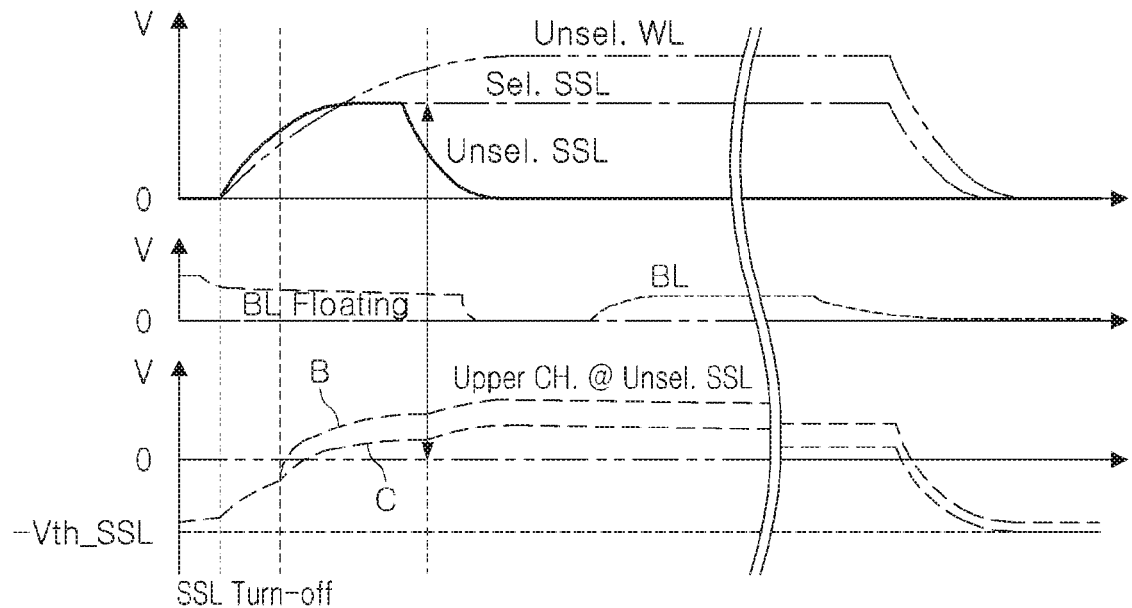
FIG. 7 is a graph illustrating a change in voltage occurring in each element in a block according to a method for initializing a channel in a non-volatile memory device according to an exemplary embodiment of the present inventive concept.
Figure 13:
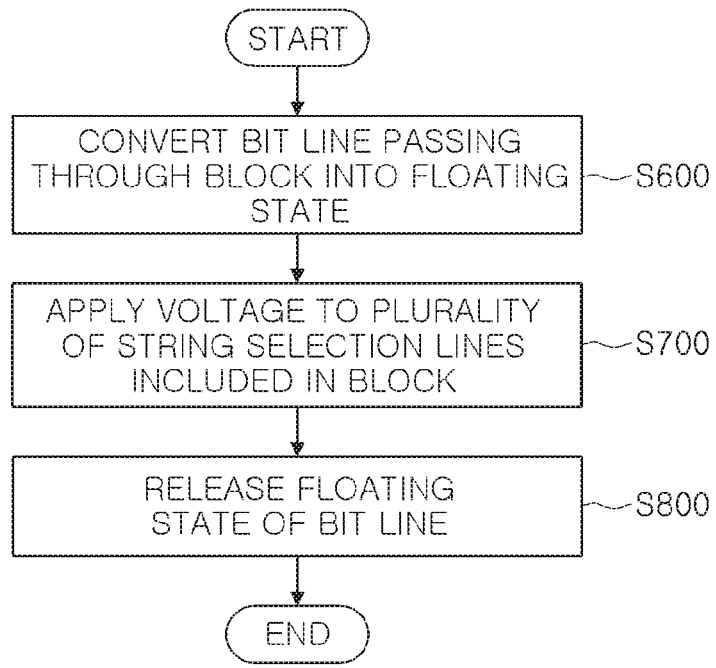
FIG. 13 is a flowchart illustrating a method for initializing a channel in a non-volatile memory device according to an exemplary embodiment of the present inventive concept.

FIG. 5 is a flowchart illustrating a method for initializing a channel in a non-volatile memory device according to an exemplary embodiment of the present inventive concept; FIG. 6 is a flowchart illustrating a method for initializing a channel in a non-volatile memory device according to an exemplary embodiment of the present inventive concept; FIG. 7 is a graph illustrating a change in voltage occurring in each element in a block according to a method for initializing a channel in a non-volatile memory device according to an exemplary embodiment of the present inventive concept; and FIG. 13 is a flowchart illustrating a method for initializing a channel in a non-volatile memory device according to an exemplary embodiment of the present inventive concept.

According to an exemplary embodiment of the present inventive concept, a method for initializing a channel in a non-volatile memory device, including a plurality of word lines and a plurality of string selection lines in a memory block includes applying a voltage to the plurality of string selection lines included in the memory block (S100); converting a bit line passing through the block into a floating state (S200); and releasing the floating state of the bit line (S300), as illustrated in FIG. 5. For example, when a given memory cell is read, the value of the bit line could become a first voltage indicating the memory cell is 0 or a second other voltage indicating the memory cell is 1. When the bit line has a floating voltage that is between the first voltage and the second voltage, the bit line can be referred to as being in a floating state.

Further, as illustrated in FIG. 6, in a method for initializing a channel in a non-volatile memory device according to an exemplary embodiment of the present inventive concept, the releasing of the floating state of the bit line (S300) is performed after a step of starting to remove a voltage applied to a non-selected string selection line among the plurality of string selection lines (S250). Further in FIG. 6, the releasing of the floating state of the bit line (S300) is completed before a step of applying a voltage required for sensing to the bit line (S350). For example, the sensing may be a read of a memory cell connected to the bit line.

In the method for initializing a channel in a non-volatile memory device according to an exemplary embodiment of the present inventive concept, a voltage difference between a word line and a channel may be reduced to reduce amounts of electric charge contributing to a parasitic capacitance in the word line, by floating a bit line BL during a turn-on period of a plurality of string selection lines or all the string selection lines included in a memory block, in a different manner to a method of initializing a channel by applying 0V or other arbitrary voltage. More specifically, a bit line BL may be floated by turning off a switch (e.g., a transistor) disposed between the bit line BL and a bit line BL driver, during a period in which selected and non-selected string selection lines are turned on to initialize a channel of a non-volatile memory device. For example, the bit line BL driver may be implemented by the above-described read/write circuit. For example, there may be a transistor between each input/output terminal of the bit line BL driver that is connected to a distinct one of the bit lines, where each of these transistors can be separately turned off as necessary to float a corresponding bit line. Therefore, the capacitance of the channel at the word line WL may be minimized by preventing a voltage applied from the bit line BL from affecting the channel.

Referring to the first graph of FIG. 7, it can be seen that, during a period when a selected string selection line (Sel. SSL) and a non-selected string selection line (Unsel. SSL) are turned on to raise a voltage, a bit line BL may maintain a floating state for a predetermined period. This may be distinguished from a method in which a fixed voltage value (e.g., 0V) is applied to the bit line BL during a period in which a voltage is raised by turning on the selected string selection line (Sel. SSL) and the non-selected string selection line (Unsel. SSL).

When a fixed voltage value is applied to the bit line BL during a period in which all the string selection lines are turned on to increase a voltage, a voltage applied to the non-selected string selection lines may be maintained at 0V during an initial period of time in which a voltage of the non-selected word line (Unsel. WL) increases, as illustrated in the third graph of FIG. 2 (i.e., to a point in time indicated by upward and downward arrows in the graph of FIG. 7), but the problem of consuming a large amount of electric charge may occur.

However, when the bit line is put in a floating state by turning off a transistor connecting the bit line BL and the bit line driver for a predetermined period during which the selected string selection line and the non-selected string selection line are turned on to raise a voltage, a voltage applied to the non-selected string selection lines may be slightly increased (e.g., to about 0.5 V), as illustrated by a curve C in the third graph of FIG. 7. Therefore, the voltage difference between the word line and the channel may be reduced to reduce amounts of electric charge contributing to a parasitic capacitance present in the word line.

When the methods described in FIGS. 3 and 4 are applied, since the channel of each non-selected string selection line may be excessively boosted by a set word line voltage, a voltage applied to any one or more of the non-selected string selection lines may be boosted to a high enough value (e.g., to about 3V) in which non-selected cells are programmed to an unintended value, for example, as illustrated by a curve B in the third graph of FIG. 7.

Therefore, at least one embodiment of the present inventive concept prevents the occurrence of a deterioration phenomena such as soft erase while reducing the amount of consumed power, by maintaining a floating state in which a specific voltage is not applied to the bit line BL for a controlled predetermined period while turning on the plurality of string selection lines included in the memory block.

The starting point of the 'predetermined period' in which a bit line is kept in a floating state may occur not only after a voltage is applied to a plurality of string selection lines included in a memory block, but also before a voltage is applied to a plurality of string selection lines.

Excessive floating can be prevented by adjusting the floating period so that the converting of the bit line into the floating state occurs after the applying of a voltage to a plurality of string selection lines. A possibility of an occurrence of excessive floating may be relatively small even when the converting of the bit line into the floating state occurs slightly after applying of a voltage to a plurality of string selection lines. Therefore, as illustrated in the first and second graphs of FIG. 7, a starting point of the 'predetermined period' in which the bit line is kept in the floating state may be set to be slightly after a point in time for applying a voltage to a plurality of string selection lines.

Therefore, a sequence of applying a voltage to the plurality of string selection lines included in the memory block (S100) and converting a bit line passing through the memory block into a floating state (S200), as illustrated in FIG. 5, may be swapped, so that a sequence of converting a bit line passing through the block into a floating state (S600) and applying a voltage to the plurality of string selection lines included in the memory block (S700), occurs as illustrated in FIG. 13.

The releasing of the floating state of the bit line may be after a step of starting to remove a voltage applied to a non-selected string selection line among the plurality of string selection lines. Referring to FIG. 7, the releasing of the floating state of the bit line can be performed, after a point in time at which a voltage applied to the non-selected string selection line (Unsel. SSL) starts to drop, for example, after a point in time at which the non-selected string selection line is turned off. In addition, the releasing of the floating state of the bit line may be completed before applying a voltage required for sensing to the bit line. In an exemplary embodiment, the releasing of the floating state of the bit line may be achieved by converting an off-state of a transistor disposed between the bit line BL and the bit line driver into an on-state thereof. For example, the releasing of the float state may be achieved by applying a control signal to a gate of the transistor that is sufficient to turn on the transistor.

Figure 8:
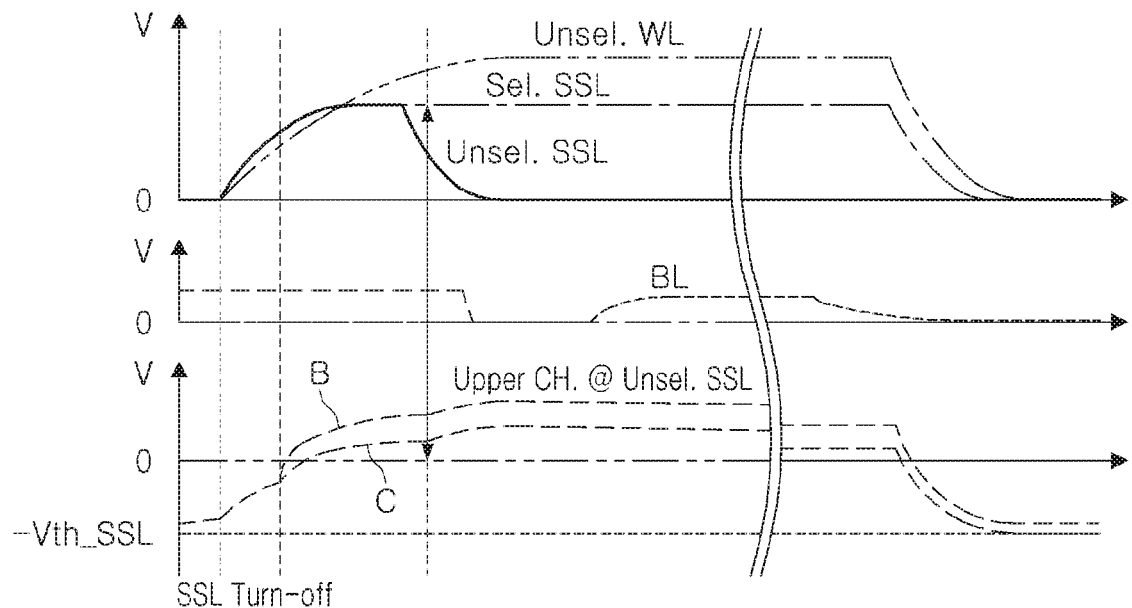
FIG. 8 is a graph illustrating a change in voltage occurring in each element in a block according to a method for initializing a channel in a non-volatile memory device according to an exemplary embodiment of the present inventive concept.

FIG. 8 is a graph illustrating a change in voltage occurring in each element in a block according to a method for initializing a channel in a non-volatile memory device according to an exemplary embodiment of the present inventive concept.

In the embodiment illustrated in FIG. 7, a bit line is kept in a floating state during a predetermined period in which a selected string selection line and a non-selected string selection line are turned on to raise a voltage. Meanwhile, in the embodiment illustrated in FIG. 8, a selected string selection line and a non-selected string selection line are turned on in a state in which the bit line is not provided with the floating state, and an intended direct current (DC) voltage is applied to the bit line using a transistor for a predetermined period in which a voltage rises. For example, as illustrated in FIG. 8, a voltage applied to the bit line may be controlled to have a constant DC voltage value for a predetermined period, by ON/OFF controlling an input signal applied to a gate terminal of P-type metal-oxide-semiconductor (PMOS) transistor in a state in which a drain terminal of the PMOS transistor is connected to the bit line and an appropriate DC voltage is applied to a source terminal of the PMOS in accordance with a voltage value between 0V and a driving voltage VDD to be supplied to the drain terminal.

Figure 9:
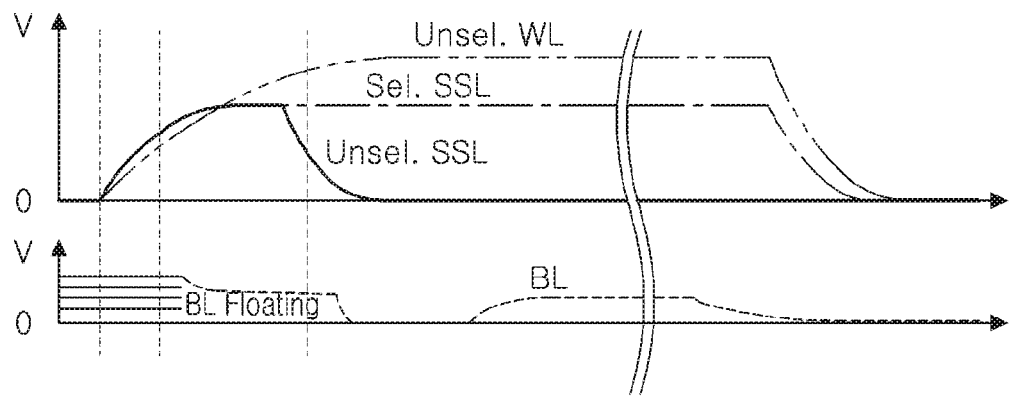
FIG. 9 is a graph illustrating a state before a floating state in a method for initializing a channel in a non-volatile memory device according to an exemplary embodiment of the present inventive concept.
Figure 10:
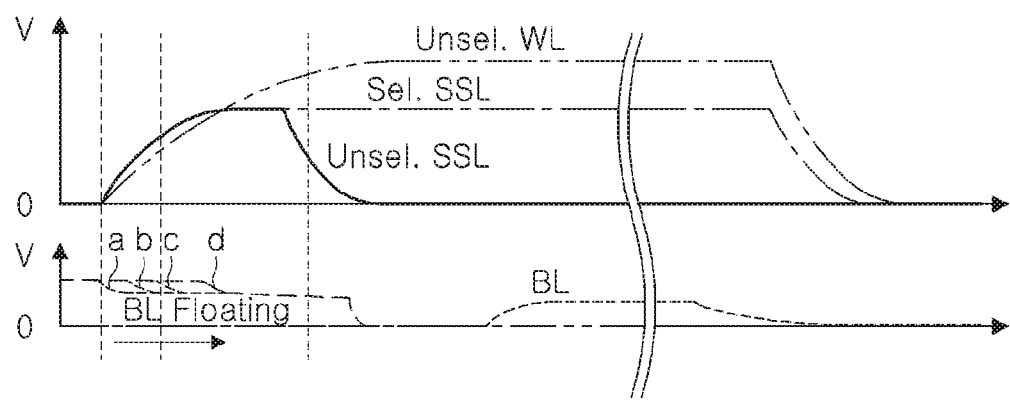
FIG. 10 is a graph illustrating controlling a point in time of converting into a floating state in a method for initializing a channel in a non-volatile memory device according to an exemplary embodiment of the present inventive concept.
Figure 11:
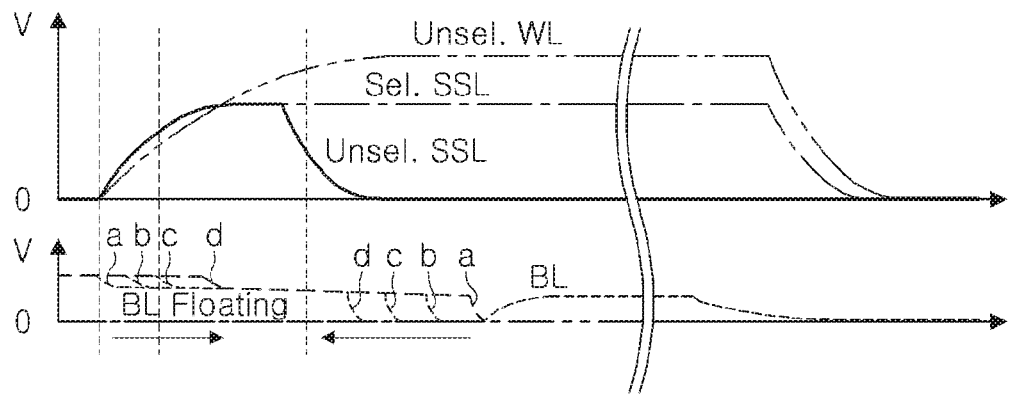
FIG. 11 and FIG. 12 are graphs illustrating controlling a point in time of converting into a floating state and a point in time of releasing (e.g., exiting from) a floating state in a method for initializing a channel in a non-volatile memory device according to an exemplary embodiment of the present inventive concept.
Figure 12:
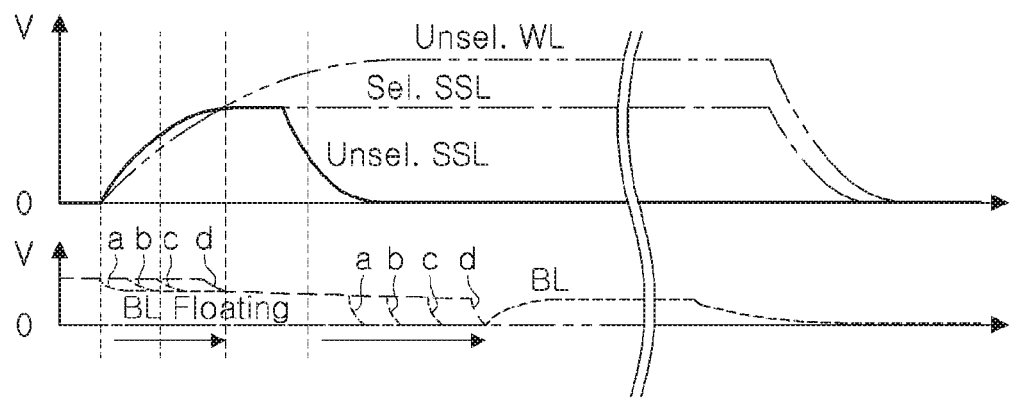

FIG. 9 is a graph illustrating a state before a floating state in a method for initializing a channel in a non-volatile memory device according to an exemplary embodiment of the present inventive concept, FIG. 10 is a graph illustrating controlling a point in time of converting into a floating state in a method for initializing a channel in a non-volatile memory device according to an exemplary embodiment of the present inventive concept, and FIG. 11 and FIG. 12 are graphs illustrating controlling a point in time of entering a floating state and a point in time of releasing a floating state in a method for initializing a channel in a non-volatile memory device according to an exemplary embodiment of the present inventive concept.

A method for initializing a channel in a non-volatile memory device according to an exemplary embodiment of the present inventive concept may further include applying a constant voltage of 0V to a driving voltage VDD to the bit line (S50), before converting a bit line passing through the memory block into a floating state (S200). In FIG. 7, an embodiment is illustrated in which a bit line is set to a floating state during a predetermined period in which a selected string selection line and a non-selected string selection line are turned on to raise a voltage. In FIG. 8, an embodiment is illustrated in which a bit line is set to have an intended DC voltage value during a predetermined period. In FIG. 9, an embodiment is illustrated in which a portion of a predetermined period has the intended DC voltage and remaining period thereof has a floating state.

As illustrated in FIG. 6, applying a constant voltage of 0V to a driving voltage VDD to the bit line (S50) is performed, before applying a voltage to the plurality of string selection lines included in the memory block (S100). Although not illustrated in FIG. 13, applying a constant voltage of 0V to a driving voltage VDD to the bit line (S50) may be performed, before converting a bit line passing through the memory block into a floating state (S600).

FIG. 9 illustrates that a point in time at which the bit line is converted into the floating state is set after a point in time at which a voltage is applied to the plurality of string selection lines, and that a constant voltage of 0V to a driving voltage VDD or less is applied to the bit line before being converted into the floating state, in a different manner to FIG. 7. The constant voltage may be preset as needed. When a constant voltage value greater than 0V is applied to the bit line before converting the bit line into the floating state, it can be expected that the voltage difference between the word line and the bit line may be reduced to reduce amounts of electric charge consumed during a period in which the constant voltage value is applied.

In a method for initializing a channel in a non-volatile memory device according to an exemplary embodiment of the present inventive concept, a point in time of converting a bit line passing through the memory block into a floating state or a point in time of releasing the floating state is set differently depending on address of the word line.

A driving voltage applied to drive the plurality of word lines present in a memory block may be different from each other as needed. For example, a voltage applied to a particular word line may be higher or lower than a voltage applied to another word line. In consideration that the word line in which an applied voltage is relatively higher may be higher than that of the word line in which an applied voltage is relatively lower, in view of the degree of boosting of the string selection line, a point in time of converting into or releasing the floating state may be controlled.

For example, as the voltage value applied to the word line becomes greater, the point in time of converting a bit line passing through the memory block into a floating state may be delayed as indicated by curves a, b, c, and d as illustrated in FIG. 10. Therefore, the degree of boosting of the string selection lines may be controlled by reducing a floating period.

Further, a point in time of converting a bit line passing through the memory block into a floating state is delayed and a point in time of releasing the floating state is advanced at the same time. As illustrated in FIG. 11, a point in time of converting a bit line passing through the block into a floating state and a point in time of releasing the floating state may be controlled together, as indicated by the curves a, b, c, and d. Although not illustrated in the figures, embodiments of the inventive concept may include those for controlling a floating period by fixing a point in time of converting a bit line passing through the memory block into a floating state and controlling a point in time of releasing the floating state.

According to an exemplary embodiment of the present inventive concept, in a method for initializing a channel in a non-volatile memory device, including a plurality of word lines passing through a memory block, the floating period may be controlled differently for a plurality of bit lines depending on a direction in which the voltage is applied to the word line.

A point to which a voltage is applied to the memory block may be pre-defined. For example, assuming that a plurality of bit lines BL0, BL1, BL2, BL3, . . . , and BLn are sequentially present in a memory block and a voltage is applied to the word line near a point at which BL0 is located, a point in time of converting a bit line passing through the block into a floating state may be delayed or a point in time of releasing the floating state may be advanced, as the bit line gets closer to a point to which a voltage is applied. This may be also to properly control the degree of boosting of the string selection lines.

According to an exemplary embodiment of the present inventive concept, in a method for initializing a channel in a non-volatile memory device, including a plurality of memory blocks, a point in time of converting a bit line passing through one of the memory blocks into a floating state or a point in time of releasing the floating state is set differently depending on address of the one memory block.

When a voltage is applied to the plurality of memory blocks included in the non-volatile memory device, since a time lag may occur due to a resistance component in the memory device, a point in time at which voltage starts to be applied for each memory block may be different. Therefore, in consideration of the occurrence of such a time lag, the floating point of the bit line may be also controlled differently depending on the address of the memory block, as illustrated in FIG. 12. For example, at least one of the point in time of converting a bit line passing through the memory block into a floating state or the point in time of releasing the floating state may be controlled as indicated by curves a, b, c, and d in FIG. 12, as the memory block is farther from a point to which a voltage is applied.

Figure 14:
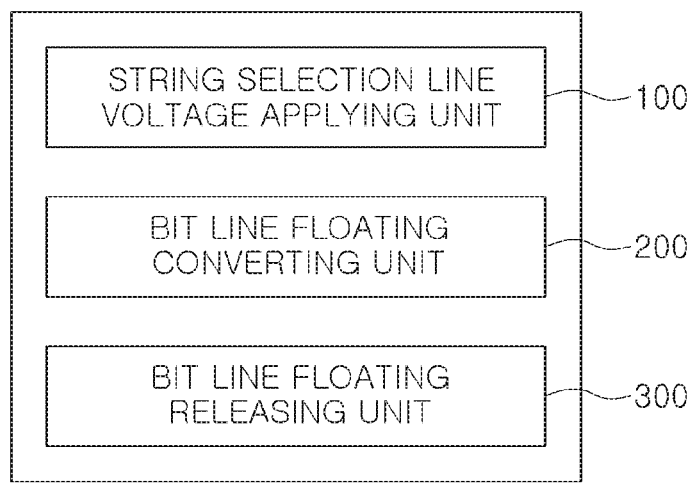
FIG. 14 is a block diagram illustrating a device for initializing a channel in a non-volatile memory device according to an exemplary embodiment of the present inventive concept.

FIG. 14 is a block diagram illustrating a device for initializing a channel in a non-volatile memory device according to an exemplary embodiment of the present inventive concept.

According to an embodiment of the present inventive concept, a device 10 for initializing a channel in a non-volatile memory device, including a plurality of word lines and a plurality of string selection lines in a memory block includes a string selection line voltage applying unit 100 (e.g., a voltage generator), a bit line floating converting unit 200 (e.g., a first control circuit), and a bit line floating releasing unit 300 (e.g., a second control circuit).

The string selection line voltage applying unit 100 may apply a voltage to a plurality of string selection lines included in the memory block.

The bit line floating converting unit 200 may convert the bit line passing through the memory block into a floating state. For example, the bit line floating converting unit 200 could be implemented by a first control circuit and a voltage generator. One or more switches maybe connected between each of the bit lines and the bit line driver. The first control circuit can apply a control signal to a given one of the switches to open the given switch to convert a corresponding bit line into the floating state. Particularly, the bit line floating converting unit 200 may apply a constant voltage of 0V or higher to a driving voltage or less to the bit line, before the bit line is converted into a floating state. For example, the voltage generator may be used to apply the constant voltage.

The bit line floating releasing unit 300 may release the floating state of the bit line. Particularly, the bit line floating releasing unit 300 may release the floating state of the bit line, after a point in time of starting to remove a voltage applied to a non-selected string selection line among the plurality of string selection lines, and before a point in time of applying a voltage required for sensing to the bit line. For example, the bit line floating releasing unit 300 could be implemented by a second control circuit. The second control circuit can apply a control signal to a given one of the switches to close the given switch to release the floating state of the bit line.

A point in time at which the bit line floating converting unit 200 enters the floating state or a point in time at which the bit line floating releasing unit 300 releases the floating state may be set differently depending on address of the word line. In particular, a point in time at which the bit line floating converting unit 200 enters the floating state may be delayed or a point in time at which the bit line floating releasing unit 300 releases the floating state may be advanced, as a value of a voltage applied to the word line becomes greater.

When a plurality of bit lines pass through the memory block, a point in time at which the bit line floating converting unit 200 enters the floating state or a point in time at which the bit line floating releasing unit 300 releases the floating state may be set differently for each bit line depending on a direction in which the voltage is applied to the word line. In particular, a point in time at which the bit line floating converting unit 200 enters the floating state may be delayed or a point in time at which the bit line floating releasing unit 300 releases the floating state may be advanced, as the bit line gets closer to a point to which a voltage is applied.

When a plurality of memory blocks are present in the non-volatile memory device and the bit line passes through the plurality of memory blocks, a point in time at which the bit line floating converting unit 200 enters the floating state or a point in time at which the bit line floating releasing unit 300 releases the floating state may be set differently depending on an address of the block. In particular, a point in time of converting a bit line passing through the block into a floating state may be delayed, or all of a point in time of converting a bit line passing through the memory block into a floating state and a point in time of releasing the floating state may be delayed, as a memory block is farther from a point to which a voltage is applied.

A function performed by the string selection line voltage applying unit 100 may correspond to the operation for applying a voltage to the plurality of string selection lines included in the memory block in the method for initializing a channel of the above-described non-volatile memory device (S100 in FIG. 2; S700 in FIG. 13). Functions performed by the bit line floating converting unit 200 may correspond to the operation for converting a bit line passing through the memory block into a floating state in the method for initializing a channel of the above-described non-volatile memory device (S200 in FIG. 2; S600 in FIG. 13), and functions performed by the bit line floating releasing unit 300 may correspond to the operation for releasing the floating state of the bit line in the method for initializing a channel of the above-described non-volatile memory device (S300 in FIG. 2; S800 in FIG. 13).

Therefore, since a detailed description of the device 10 for initializing a channel in a non-volatile memory device can be understood with reference to the detailed description of the method for initializing a channel in a non-volatile memory device and its corresponding drawings, an overlapped explanation thereof will be omitted.

The term "unit" used in the present disclosure may refer to software components, and hardware components such as a field programmable gate array (FPGA) or an application specific integrated circuit (ASIC). The unit performs certain functions. The module is not meant to be limited to software or hardware components. The unit may be configured to be stored on an addressable storage medium, and configured to execute one or more processors. The unit may include components such as software components, object-oriented software components, class components, and task components, and processes, functions, attributes, procedures, subroutines, segments of program code, drivers, firmware, microcode, circuitry, data, databases, data structures, tables, arrays, and variables, as will be appreciated by those skilled in the art. The functions provided in the components and units may be combined into a smaller number of components and modules, or may be further separated into additional components and modules. In addition, components and modules may be implemented to execute one or more CPUs in the device.

It is to be understood by those skilled in the art that the present inventive concept may be embodied in other specific forms without departing from the scope of the inventive concept. It can be therefore understood that the above-described embodiments are illustrative in all aspects and not restrictive. It should be interpreted that the scope of the present inventive concept may be defined by the appended claims rather than the detailed description, and all changes or modifications derived from the meaning and scope of the claims and the equivalents thereof may be included in the scope of the present inventive concept.

In a method for initializing a channel in a non-volatile memory device according to at least one exemplary embodiment of the present inventive concept, power consumption may be reduced by controlling the bit lines at the time of initializing the selected and non-selected string selection lines when performing a reading or writing verification operation.

While exemplary embodiments have been shown and described above, it will be apparent to those skilled in the art that modifications and variations can be made without departing from the scope of the present inventive concept.

What is claimed is:

1. A method for initializing a channel in a non-volatile memory device comprising a memory block including a plurality of word lines and a plurality of string selection lines, comprising:
applying a voltage to the plurality of string selection lines;
converting a bit line passing through the memory block into a floating state by electrically disconnecting the bit line from a corresponding bit line driver; and
releasing the floating state of the bit line.

2. The method according to claim 1, wherein the releasing of the floating state of the bit line is performed after a point in time of starting to remove a voltage applied to a non-selected string selection line among the plurality of string selection lines, and is completed before a point in time of applying a voltage required for sensing to the bit line.

3. The method according to claim 1, wherein the converting of the bit line passing through the memory block into the floating state converts from a state in which the bit line is not provided in a floating state into a state in which a constant voltage of 0V or higher to a driving voltage or less is applied.

4. The method according to claim 1, wherein, in the converting of the bit line passing through the memory block into the floating state, a constant voltage from 0V or higher to a driving voltage or less is applied to the bit line, before the bit line is converted into the floating state.

5. The method according to claim 1, wherein a point in time of converting the bit line into the floating state or a point in time of releasing the floating state of the bit line is set differently depending on an address of one of the word lines.

6. The method according to claim 5, wherein a point in time of converting the bit line into the floating state is delayed or a point in time of releasing the floating state of the bit line is advanced, as a value of the voltage applied to the one word line becomes greater.

7. The method according to claim 1, wherein the bit line is one of a plurality of bit lines passing through the memory block, wherein a point in time of converting the bit line into the floating state or a point in time of releasing the floating state of the bit line is set differently for each of the bit lines depending on a direction in which the voltage is applied to one of the word lines.

8. The method according to claim 1, wherein the bit line is one of a plurality of bit lines passing through the memory block, and wherein a point in time of converting the bit line into the floating state is delayed or a point in time of releasing the floating state of the bit line is advanced, as the bit line gets closer to a point to which the voltage is applied.

9. The method according to claim 1, wherein the non-volatile memory device comprises a plurality of memory blocks, and the bit line passes through the plurality of memory blocks, wherein a point in time of converting the bit line into the floating state or a point in time of releasing the floating state of the bit line is set differently depending on addresses of the memory blocks.

10. The method according to claim 9, wherein a point in time of converting the bit line into the floating state is delayed, as a memory block is farther from a point to which the voltage is applied.

11. The method according to claim 1, wherein the converting into the floating state is performed by turning off a transistor disposed between the bit line passing through the memory block and a bit line driver.

12. A method for initializing a channel in a non-volatile memory device comprising a memory block including a plurality of word lines and a plurality of string selection lines, comprising:
 converting a bit line passing through the memory block into a floating state by electrically disconnecting the bit line from a corresponding bit line driver;
 applying a voltage to the plurality of string selection lines; and
 releasing the floating state of the bit line.

13. A device for initializing a channel in a non-volatile memory device comprising a memory block including a plurality of word lines and a plurality of string selection lines, comprising:
 a voltage generator configured to apply a voltage to the plurality of string selection lines;
 a first control circuit configured to convert a bit line passing through the memory block into a floating state by electrically disconnecting the bit line from a corresponding bit line driver; and
 a second control circuit configured to release the floating state of the bit line.

14. The device according to claim 13, wherein the second control circuit releases the floating state of the bit line, after a point in time of starting to remove a voltage applied to a non-selected string selection line among the plurality of string selection lines, and before a point in time of applying a voltage required for sensing to the bit line.

15. The device according to claim 13, wherein a point in time at which the first control circuit converts the bit line into the floating state or a point in time at which the second control circuit releases the floating state of the bit line is set differently depending on an address of one of the word lines.

16. The device according to claim 15, wherein a point in time at which the first control circuit converts the bit line into a floating state is delayed or a point in time at which the second control circuit releases the floating state of the bit line is advanced, as a value of the voltage applied to the one word line becomes greater.

17. The device according to claim 13, wherein a point in time at which the first control circuit converts the bit line into a floating state or a point in time at which the second control circuit releases the floating state of the bit line is set differently depending on a direction in which the voltage is applied to one of the word lines.

18. The device according to claim 17, wherein the bit line is one of a plurality of bit lines passing through the memory block, and wherein a point in time at which the first control circuit converts the bit line into a floating state is delayed or a point in time at which the second control circuit releases the floating state of bit line is advanced, as the bit line gets closer to a point to which the voltage is applied.

19. The device according to claim 13, wherein the non-volatile memory device comprises a plurality of memory blocks, and the bit line passes through the plurality of memory blocks, wherein a point in time at which the first control circuit converts the bit line into a floating state or a point in time at which the second control circuit releases the floating state of the bit line is set differently depending on an address of the memory blocks.

20. The device according to claim 13, wherein the first control circuit applies a constant voltage of 0V or higher to a driving voltage or less to the bit line, before the bit line is converted into the floating state.

* * * * *